United States Patent
Xu

(10) Patent No.: US 10,115,921 B2
(45) Date of Patent: *Oct. 30, 2018

(54) QUANTUM DOT LIGHT EMITTING ELEMENT, METHOD OF FABRICATING THE SAME, AND LIQUID-CRYSTAL DISPLAY

(71) Applicant: Shenzhen China Star Optoelectronics Technology Co., Ltd., Shenzhen, Guangdong (CN)

(72) Inventor: Chao Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 149 days.

This patent is subject to a terminal disclaimer.

(21) Appl. No.: 15/101,125

(22) PCT Filed: May 11, 2016

(86) PCT No.: PCT/CN2016/081681
§ 371 (c)(1),
(2) Date: Jun. 2, 2016

(87) PCT Pub. No.: WO2017/128552
PCT Pub. Date: Aug. 3, 2017

(65) Prior Publication Data
US 2018/0047924 A1     Feb. 15, 2018

(30) Foreign Application Priority Data
Jan. 25, 2016  (CN) .......................... 2016 1 0050060

(51) Int. Cl.
*H01L 51/50* (2006.01)
*H01L 51/56* (2006.01)
(Continued)

(52) U.S. Cl.
CPC .......... *H01L 51/502* (2013.01); *G02F 1/1333* (2013.01); *H01L 51/0007* (2013.01);
(Continued)

(58) Field of Classification Search
CPC ............. H01L 51/0545; H01L 51/0036; H01L 51/0541; H01L 51/5012; H01L 33/32;
(Continued)

(56) References Cited

U.S. PATENT DOCUMENTS 8,384,071 B2 * 2/2013 Yang .................. H01L 51/5048
257/13
9,960,378 B2 * 5/2018 Xu ........................ H01L 51/502
(Continued)

FOREIGN PATENT DOCUMENTS

CN      102263205 A      11/2011
CN      103730584 A       4/2014
(Continued)

*Primary Examiner* — Quoc Hoang
(74) *Attorney, Agent, or Firm* — Andrew C. Cheng

(57) ABSTRACT

A quantum dot light emitting element includes a substrate, a cathode arranged on the substrate for supplying electrons, an electron injection/electron transport layer, a quantum dot light emitting layer, a hole injection/hole transport layer, and an anode for supplying holes. The cathode and the anode are arranged on the same side of the substrate. The electron injection/electron transport layer, the quantum dot light emitting layer, and the hole injection/hole transport layer are inserted between the cathode and the anode. One side of the electron injection/electron transport layer is connected to the cathode. The electron injection/electron transport layer and hole injection/hole transport layer are used for transmitting the electrons and the holes to the quantum dot light emitting layer, respectively. The electrons and the holes recombine in the quantum dot light emitting layer for emitting light. The (Continued)

electron injection/electron transport layer comprises a water-alcohol soluble conjugated polymer (WACPs).

15 Claims, 3 Drawing Sheets

(51) Int. Cl.
  *G02F 1/1333* (2006.01)
  *H01L 51/00* (2006.01)
(52) U.S. Cl.
  CPC .......... *H01L 51/50* (2013.01); *H01L 51/5056* (2013.01); *H01L 51/5084* (2013.01); *H01L 51/56* (2013.01); *H01L 2227/323* (2013.01); *H05K 999/99* (2013.01)
(58) Field of Classification Search
  CPC ..... H01L 33/06; H01L 33/0073; H01L 51/50; H01L 51/502; H01L 51/5056
  See application file for complete search history.

(56) References Cited

U.S. PATENT DOCUMENTS

| | | | |
|---|---|---|---|
| 2010/0096656 | A1 | 4/2010 | Nguyen |
| 2010/0224859 | A1* | 9/2010 | Gough ................... B82Y 20/00 257/13 |
| 2011/0284825 | A1 | 11/2011 | Yang |
| 2016/0079316 | A1* | 3/2016 | Zhou ................... H01L 51/5278 257/13 |
| 2016/0233447 | A1* | 8/2016 | Kim ..................... A61B 5/6826 |
| 2018/0047923 | A1* | 2/2018 | Xu ........................ H01L 51/502 |

FOREIGN PATENT DOCUMENTS

| | | |
|---|---|---|
| CN | 103840053 A | 6/2014 |
| CN | 103972416 A | 8/2014 |
| CN | 105185919 A | 12/2015 |
| CN | 105470387 A | 4/2016 |

* cited by examiner

QUANTUM DOT LIGHT EMITTING ELEMENT, METHOD OF FABRICATING THE SAME, AND LIQUID-CRYSTAL DISPLAY

CROSS REFERENCE

This application is claims the benefit and priority of Chinese Application No. 201610050060.3, entitled "Quantum dot light emitting element, method of fabricating the same, and liquid crystal display", filed on Jan. 25, 2016, the disclosure of which is incorporated herein by reference in its entirety.

FIELD OF THE INVENTION

The present invention relates to the field of display, and more particularly, to a quantum dot light emitting element, a method of fabricating the device, and a liquid crystal display (LCD).

BACKGROUND OF THE INVENTION

A quantum dot light emitting element, such as a quantum dot light emitting diode (QLED), is known as a new generation lighting device following an organic light-emitting element owing to merits of wide color gamut, high color purity, high stability, low power consumption, low costs, etc. The QLED comprises a quantum dot light emitting layer, a hole transport layer, and an electron transport layer. The electron transport layer, the quantum dot light emitting layer, and the hole transport layer are layered subsequently. The formation of the electron transport layer, the quantum dot light emitting layer, and the hole transport layer is that relevant materials are dissolved in organic solutions, and then a film is respectively formed with the method of spin coating. That is, the electron transport layer, the quantum dot light emitting layer, and the hole transport layer each are fabricated. Normally, a first layer is fabricated, and then a second layer is fabricated. The formation of the films requires the organic solutions. So, a processed film may damage adjacent formed film in the process of fabricating the QLED, which causes poor lighting efficiency of the QLED and low probability of success of fabrication.

SUMMARY OF THE INVENTION

The present invention proposes a quantum dot light emitting element comprising: a substrate, a cathode, an electron injection/electron transport layer, a quantum dot light emitting layer, a hole injection/hole transport layer, and an anode. The cathode is arranged on the substrate. The cathode and the anode is arranged on the same side of the substrate. The cathode is opposite to the anode with some in-between space. The electron injection/electron transport layer, the quantum dot light emitting layer, and the hole injection/hole transport layer are inserted between the cathode and the anode. One side of the electron injection/electron transport layer is connected to the cathode. The quantum dot light emitting layer and the hole injection/hole transport layer are subsequently layered on a surface of the electron injection/electron transport layer away from the cathode. The hole injection/hole transport layer is away from a surface of the quantum dot light emitting layer and is connected to the anode. The cathode is used for supplying electrons; the anode is used for supplying holes. The electron injection/electron transport layer is used for transmitting the electrons to the quantum dot light emitting layer. The hole injection/hole transport layer is used for transmitting the holes to the quantum dot light emitting layer. The electrons and the holes recombine in the quantum dot light emitting layer for emitting light. The electron injection/electron transport layer comprises a water-alcohol soluble conjugated polymer (WACPs).

Furthermore, the WACPs comprises any one of PFN, PFNBr, and PFNSO, or an arbitrary combination of PFN, PFNBr, and PFNSO.

Furthermore, the cathode comprises indium tin oxide (ITO).

Furthermore, the hole injection/hole transport layer comprises a p-type metal oxide, and the p-type metal oxide comprises any one of $MoO_3$, $NiO$, $V_2O_5$, and $WoO_3$, or an arbitrary combination of $MoO_3$, $NiO$, $V_2O_5$, and $WoO_3$.

Furthermore, a thickness of the electron injection/electron transport layer ranges from 5 nm to 10 nm.

Furthermore, a thickness of the quantum dot light emitting layer ranges from 30 nm to 40 nm.

Furthermore, the quantum dot light emitting layer comprises one single layer or multiple layers of quantum dots.

Furthermore, the anode comprises aluminum (Al), and a thickness of the anode ranges from 100 nm to 150 nm.

The present invention also proposes a method of fabricating a quantum dot light emitting element. The method comprises:

supplying a substrate;

forming a cathode on a surface of the substrate;

coating an electron injection/electron transport material on a surface of the cathode away from the substrate for forming an electron injection/electron transport layer wherein the electron injection/electron transport layer comprises a water-alcohol soluble conjugated polymer (WACPs);

coating a quantum dot light emitting material on a surface of the electron injection/electron transport layer away from the cathode for forming a quantum dot light emitting layer;

coating a hole injection and hole transport material on a surface of the quantum dot light emitting layer away from the electron injection/electron transport layer for forming a hole injection and hole transport layer;

depositing metal on a surface of the hole injection and hole transport layer away from the quantum dot light emitting layer for forming an anode.

The present invention further proposes a liquid crystal display comprising a quantum dot light emitting element as provided above.

Compared with the conventional technology, an electron injection/electron transport layer proposed by the present invention comprises water-alcohol soluble conjugated polymers (WACPs). The WACPs can be dissolved in a solution with a larger polarity such as water and formaldehyde. A quantum dot light emitting layer cannot be damaged when the electron injection/electron transport layer is fabricated to be a film. Also, the performance of the quantum dot light emitting element is improved. In addition, the WACPs are non-toxic. In other words, the WACPs are eco-friendly since it does no harm to the environment when being produced.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

FIG. 1 is a schematic diagram of a quantum dot light emitting element according to one preferred embodiment of the present invention.

DETAILED DESCRIPTION OF PREFERRED EMBODIMENTS

Embodiments of the present invention are described in detail with the technical matters, structural features, achieved objects, and effects with reference to the accompanying drawings as follows. Specifically, the terminologies in the embodiments of the present invention are merely for describing the purpose of the certain embodiment, but not to limit the invention.

Figure 1:
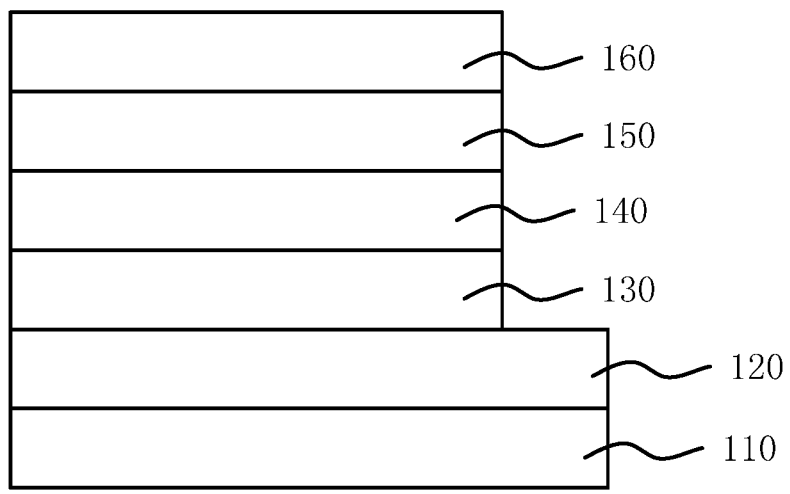

Please refer to FIG. 1. FIG. 1 is a schematic diagram of a quantum dot light emitting element 100 according to one preferred embodiment of the present invention. The quantum dot light emitting element 100 comprises a substrate 110, a cathode 120, an electron injection/electron transport layer 130, a quantum dot light emitting layer 140, a hole injection/hole transport layer 150, and an anode 160. The cathode 120 is arranged on the substrate 110. The cathode 120 and the anode 160 are arranged on the same side of the substrate 110. The cathode 120 is opposite to the anode 160 with some in-between space. The electron injection/electron transport layer 130, the quantum dot light emitting layer 140, and the hole injection/hole transport layer 150 are inserted between the cathode 120 and the anode 160. One side of the electron injection/electron transport layer 130 is connected to the cathode 120. The quantum dot light emitting layer 140 and the hole injection/hole transport layer 150 are subsequently layered on the surface of the electron injection/electron transport layer 130 away from the cathode 120. The hole injection/hole transport layer 150 is away from the surface of the quantum dot light emitting layer 140 and is connected to the anode 160. The cathode 120 is used for supplying electrons. The anode 160 is used for supplying holes. The electron injection/electron transport layer 130 is used for transmitting the electrons to the quantum dot light emitting layer 140. The hole injection/hole transport layer 150 is used for transmitting the holes to the quantum dot light emitting layer 140. The electrons and the holes become compounds in the quantum dot light emitting layer 140 for emitting light. The electron injection/electron transport layer 130 comprises a water-alcohol soluble conjugated polymer (WACPs).

The WACPs is formed by a conjugate skeleton and a lateral chain of a strong polar group (such as amido, diethanolamine, phosphate, carboxyl, hyamine, carboxylate radical, sulfonate, zwitterionic groups, etc.) In one of the preferred embodiments, the WACPs comprises any one of PFN, PFNBr, and PFNSO, or an arbitrary combination of PFN, PFNBr, and PFNSO. The WACPs is used to fabricate the electron injection/electron transport layer 130. The WACPs can be dissolved in a solution with a larger polarity such as water and formaldehyde. The quantum dot light emitting layer 140 cannot be damaged when the electron injection/electron transport layer 130 is fabricated to be a film. Also, the performance of the quantum dot light emitting element 100 is improved. In addition, the WACPs are non-toxic so it does no harm to the environment in the production, which means it is eco-friendly.

The substrate 110 is a transparent substrate. The substrate 110 is, but is not limited to, a glass substrate, a plastic substrate, etc.

The cathode 120 comprises indium tin oxide (ITO). The cathode 120 is arranged on one surface of the substrate 110.

The thickness of the electron injection/electron transport layer 130 ranges from 5 nm to 10 nm.

The thickness of the quantum dot light emitting layer 140 ranges from 30 nm to 40 nm. The quantum dot light emitting layer 140 comprises one single layer or multiple layers of quantum dots.

The hole injection/hole transport layer 150 comprises a p-type metal oxide. The p-type metal oxide comprises any one of $MoO_3$, $NiO$, $V_2O_5$, and $WoO_3$, or an arbitrary combination of $MoO_3$, $NiO$, $V_2O_5$, and $WoO_3$. Preferably, the thickness of the hole injection/hole transport layer 150 ranges from 100 nm to 150 nm.

The anode 160 is a metal such as aluminum (Al). The thickness of the anode 160 ranges from 100 nm to 150 nm.

Compared with the conventional technology, an electron injection/electron transport layer 130 of the quantum dot light emitting element 100 proposed by the present invention comprises water-alcohol soluble conjugated polymers (WACPs). The WACPs can be dissolved in a solution with a larger polarity such as water and formaldehyde. A quantum dot light emitting layer 140 cannot be damaged when the electron injection/electron transport layer 130 is fabricated to be a film. Also, the performance of the quantum dot light emitting element 100 is improved. In addition, the WACPs are non-toxic. In other words, the WACPs are eco-friendly since it does no harm to the environment when being produced.

Figure 2:
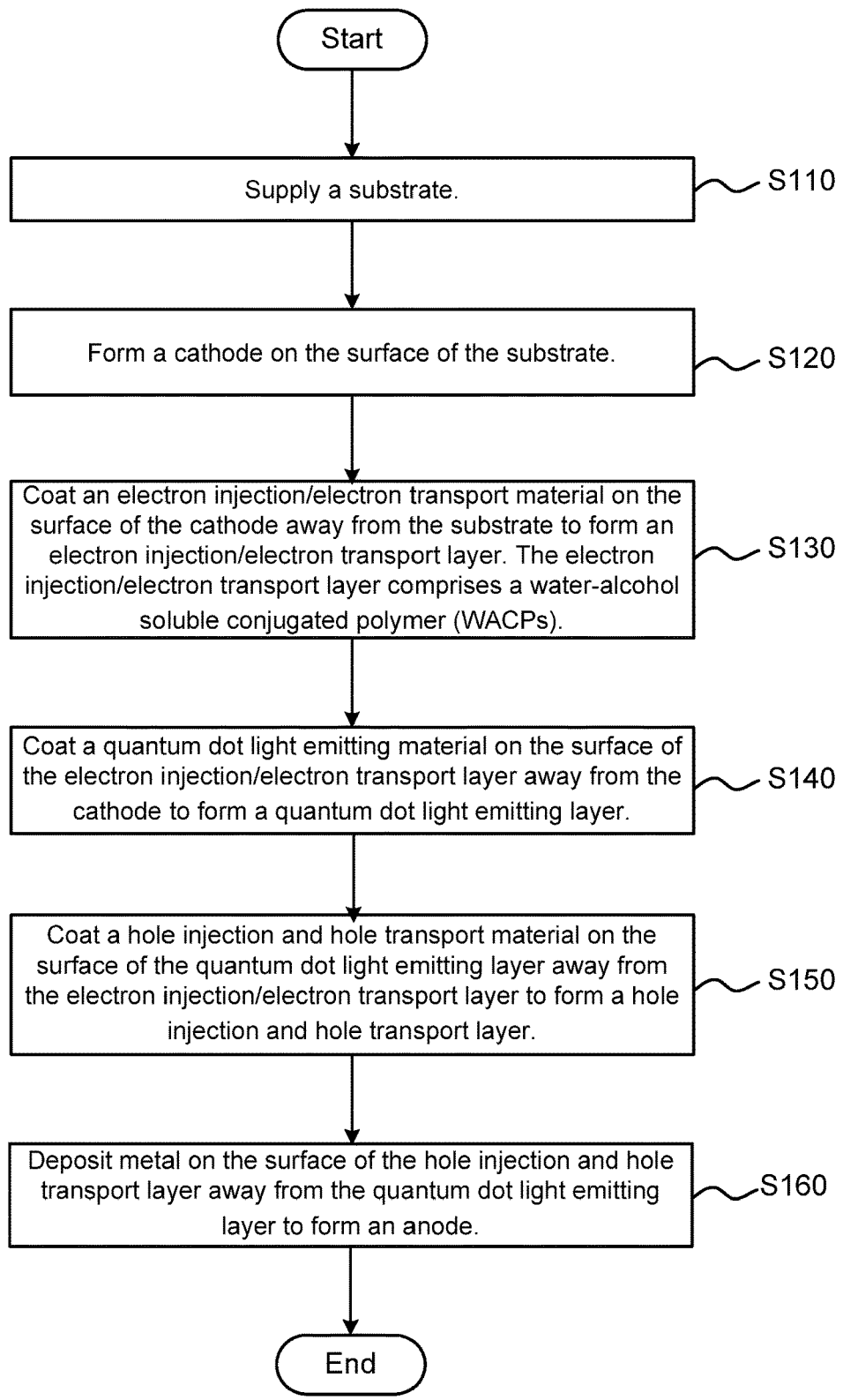
FIG. 2 shows a flowchart of a method of fabricating the quantum dot light emitting element according to a preferred embodiment of the present invention.

The method of fabricating the quantum dot light emitting element 100 is elaborated based on the above-mentioned quantum dot light emitting element 100 and FIG. 1. Please refer to FIG. 2 showing a flowchart of a method of fabricating the quantum dot light emitting element 100 according to a preferred embodiment of the present invention. The method comprises, but is not limited to, the following steps:

Step S110: Supply a substrate 110.

Step S120: Form a cathode 120 on the surface of the substrate 110.

Step S130: Coat an electron injection/electron transport material on the surface of the cathode 120 away from the substrate 110 to form an electron injection/electron transport layer 130. The electron injection/electron transport layer 130 comprises a water-alcohol soluble conjugated polymer (WACPs). Specifically, the electron injection/electron transport layer 130 is formed through a method like spin coating. According to the method of spin coating, the electron injection/electron transport material is coated on the surface of the cathode 120 away from the substrate 110 to form the electron injection/electron transport layer 130.

Step S140: Coat a quantum dot light emitting material on the surface of the electron injection/electron transport layer 130 away from the cathode 120 to form a quantum dot light emitting layer 140. Specifically, the quantum dot light emitting layer 140 is formed through a method like spin coating. According to the method of spin coating, the quantum dot light emitting material is coated on the surface of electron injection/electron transport layer 130 away from the cathode 120 to form the quantum dot light emitting layer 140.

Step S150: Coat a hole injection and hole transport material on the surface of the quantum dot light emitting layer 140 away from the electron injection/electron transport layer 130 to form a hole injection and hole transport layer 150. Specifically, the hole injection and hole transport layer 150 is formed through a method like spin coating. According to the method of spin coating, the hole injection and hole transport material is coated on the surface of the quantum dot light emitting layer 140 away from the electron injection/electron transport layer 130 to form the hole injection and hole transport layer 150.

Step S160: Deposit metal on the surface of the hole injection and hole transport layer 150 away from the quantum dot light emitting layer 140 to form an anode 160. Specifically, the anode 160 is formed through a method like evaporation. According to the method of evaporation, metal, such as aluminum (Al), is formed on the surface of the hole injection and hole transport layer 150 away from the quantum dot light emitting layer 140 to fabricate the anode 160.

Figure 3:
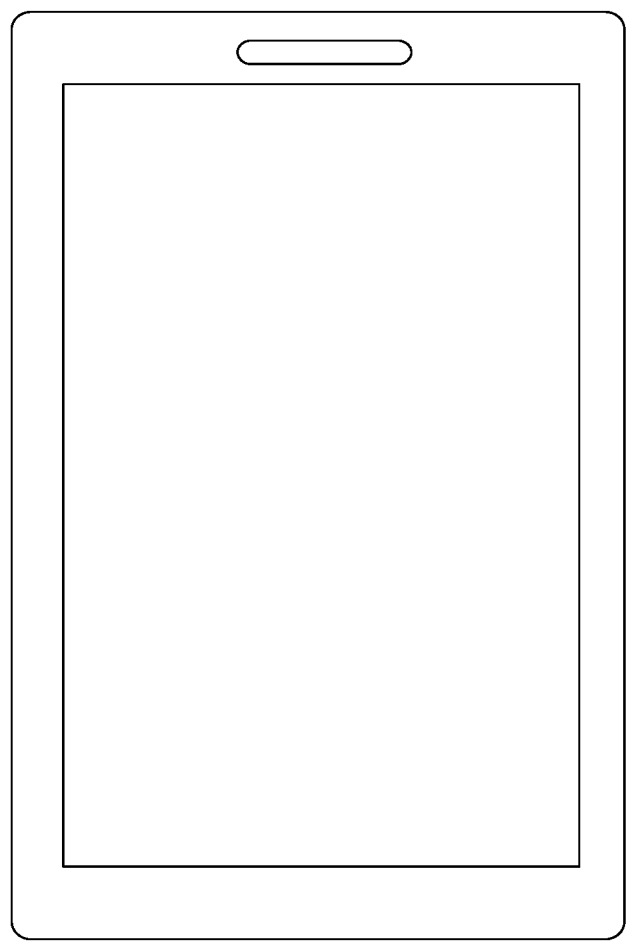
FIG. 3 shows a schematic diagram of a liquid crystal display according to one preferred embodiment of the present invention.

The present invention further proposes a liquid crystal display (LCD) 10. Please refer to FIG. 3. The LCD 10 comprises the above-mentioned quantum dot light emitting element 100 so the detail of the quantum dot light emitting element 100 will not be disclosed. The LCD 10 comprises, but is not limited to, portable electric devices, such as smart phones, mobile internet devices (MIDs), e-books, play station portables (PSPs), and personal digital assistant (PDAs), and liquid crystal devices (LCDs).

Above are embodiments of the present invention, which does not limit the scope of the present invention. Any modifications, equivalent replacements or improvements within the spirit and principles of the embodiment described above should be covered by the protected scope of the invention.

What is claimed is:

1. A quantum dot light emitting element, comprising: a substrate, a cathode, an electron injection/electron transport layer, a quantum dot light emitting layer, a hole injection/hole transport layer, and an anode, wherein the cathode is arranged on the substrate; the cathode and the anode is arranged on the same side of the substrate; the cathode is opposite to the anode with some in-between space; the electron injection/electron transport layer, the quantum dot light emitting layer, and the hole injection/hole transport layer are inserted between the cathode and the anode; one side of the electron injection/electron transport layer is connected to the cathode; the quantum dot light emitting layer and the hole injection/hole transport layer are subsequently layered on a surface of the electron injection/electron transport layer away from the cathode; the hole injection/hole transport layer is away from a surface of the quantum dot light emitting layer and is connected to the anode; the cathode is used for supplying electrons; the anode is used for supplying holes; the electron injection/electron transport layer is used for transmitting the electrons to the quantum dot light emitting layer; the hole injection/hole transport layer is used for transmitting the holes to the quantum dot light emitting layer; the electrons and the holes recombine in the quantum dot light emitting layer for emitting light; and wherein the electron injection/electron transport layer comprises a water-alcohol soluble conjugated polymer (WACPs);
wherein the WACPs comprises one of PFNBr (Bromine Polyfluorene) and PFNSO (Sulfo-Polyfluorene).

2. The quantum dot light emitting element of claim 1, wherein the cathode comprises indium tin oxide (ITO).

3. The quantum dot light emitting element of claim 1, wherein the hole injection/hole transport layer comprises a p-type metal oxide, and the p-type metal oxide comprises any one of MoO3, NiO, V2O5, and WoO3, or an arbitrary combination of MoO3, NiO, V2O5, and WoO3.

4. The quantum dot light emitting element of claim 1, wherein a thickness of the electron injection/electron transport layer ranges from 5 nm to 10 nm.

5. The quantum dot light emitting element of claim 1, wherein a thickness of the quantum dot light emitting layer ranges from 30 nm to 40 nm.

6. The quantum dot light emitting element of claim 1, wherein the quantum dot light emitting layer comprises one single layer or multiple layers of quantum dots.

7. The quantum dot light emitting element of claim 1, wherein the anode comprises aluminum (Al), and a thickness of the anode ranges from 100 nm to 150 nm.

8. A method of fabricating a quantum dot light emitting element, comprising:
supplying a substrate;
forming a cathode on a surface of the substrate;
coating an electron injection/electron transport material on a surface of the cathode away from the substrate for forming an electron injection/electron transport layer wherein the electron injection/electron transport layer comprises a water-alcohol soluble conjugated polymer (WACPs);
coating a quantum dot light emitting material on a surface of the electron injection/electron transport layer away from the cathode for forming a quantum dot light emitting layer;
coating a hole injection and hole transport material on a surface of the quantum dot light emitting layer away from the electron injection/electron transport layer for forming a hole injection and hole transport layer;
depositing metal on a surface of the hole injection and hole transport layer away from the quantum dot light emitting layer for forming an anode;
wherein the WACPs comprises one of PFNBr (Bromine Polyfluorene) and PFNSO (Sulfo-Polyfluorene).

9. A liquid crystal display comprising a quantum dot light emitting element, the quantum dot light emitting element comprising: a substrate, a cathode, an electron injection/electron transport layer, a quantum dot light emitting layer, a hole injection/hole transport layer, and an anode, wherein the cathode is arranged on the substrate; the cathode and the anode is arranged on the same side of the substrate; the cathode is opposite to the anode with some in-between space; the electron injection/electron transport layer, the quantum dot light emitting layer, and the hole injection/hole transport layer are inserted between the cathode and the anode; one side of the electron injection/electron transport layer is connected to the cathode; the quantum dot light emitting layer and the hole injection/hole transport layer are subsequently layered on a surface of the electron injection/electron transport layer away from the cathode; the hole injection/hole transport layer is away from a surface of the quantum dot light emitting layer and is connected to the anode; the cathode is used for supplying electrons; the anode is used for supplying holes; the electron injection/electron transport layer is used for transmitting the electrons to the quantum dot light emitting layer; the hole injection/hole transport layer is used for transmitting the holes to the quantum dot light emitting layer; the electrons and the holes recombine in the quantum dot light emitting layer for emitting light; and wherein the electron injection/electron transport layer comprises a water-alcohol soluble conjugated polymer (WACPs);

wherein the WACPs comprises one of PFNBr (Bromine Polyfluorene) and PFNSO (Sulfo-Polyfluorene).

10. The liquid crystal display of claim 9, wherein the cathode comprises indium tin oxide (ITO).

11. The liquid crystal display of claim 9, wherein the hole injection/hole transport layer comprises a p-type metal oxide, and the p-type metal oxide comprises any one of $MoO_3$, $NiO$, $V_2O_5$, and $WoO_3$, or an arbitrary combination of $MoO_3$, $NiO$, $V_2O_5$, and $WoO_3$.

12. The liquid crystal display of claim 9, wherein a thickness of the electron injection/electron transport layer ranges from 5 nm to 10 nm.

13. The liquid crystal display of claim 9, wherein a thickness of the quantum dot light emitting layer ranges from 30 nm to 40 nm.

14. The liquid crystal display of claim 9, wherein the quantum dot light emitting layer comprises one single layer or multiple layers of quantum dots.

15. The liquid crystal display of claim 9, wherein the anode comprises aluminum (Al), and a thickness of the anode ranges from 100 nm to 150 nm.

* * * * *